(12) United States Patent
Johancsik et al.

(10) Patent No.: US 8,525,596 B2
(45) Date of Patent: Sep. 3, 2013

(54) REFERENCE BUFFER AMPLIFIER

(75) Inventors: Tracy Johancsik, Murray, UT (US); Rex K. Hales, Riverton, UT (US); Ryan James Kier, Salt Lake City, UT (US); Yusuf Haque, Woodside, CA (US)

(73) Assignee: Crest Semiconductors, Inc., San Jose, CA (US)

(*) Notice: Subject to any disclaimer, the term of this patent is extended or adjusted under 35 U.S.C. 154(b) by 0 days.

(21) Appl. No.: 13/294,864

(22) Filed: Nov. 11, 2011

(65) Prior Publication Data

US 2013/0120066 A1     May 16, 2013

(51) Int. Cl.
*H03F 3/14*     (2006.01)
(52) U.S. Cl.
USPC ............................................................ 330/307
(58) Field of Classification Search
USPC ................. 330/307, 252–261, 277; 327/304, 327/108, 561
See application file for complete search history.

(56) References Cited

U.S. PATENT DOCUMENTS

| | | | |
|---|---|---|---|
| 4,495,472 A * | 1/1985 | Dwarakanath | 330/277 |
| 6,285,231 B1 * | 9/2001 | Opris et al. | 327/304 |
| 7,215,182 B2 | 5/2007 | Ali | |
| 8,009,070 B2 | 8/2011 | Johansson et al. | |
| 2011/0193732 A1 | 8/2011 | Sestok et al. | |

* cited by examiner

*Primary Examiner* — Hieu Nguyen
(74) *Attorney, Agent, or Firm* — Steven l. Nichols; Van Cott, Bagley, Cornwall & McCarthy P.C.

(57) ABSTRACT

A reference buffer amplifier within an integrated circuit includes a first output terminal connected to a first bond pad, the first bond pad being connected to a first external pin of the integrated circuit chip, the first external pin to allow an external capacitance to be connected to the output terminal. The reference buffer further includes a variable, settable resistance sub-circuit connected to a second bond pad, the second bond pad also being connected to the first external pin. The resistance sub-circuit is configured to be set to exhibit a resistance value to critically dampen a response of the reference buffer amplifier.

21 Claims, 5 Drawing Sheets

Apply a voltage to a reference buffer amplifier, an output of the reference buffer amplifier being connected to a first bond pad, the first bond pad being connected to an external pin, the external pin configured to have an external capacitance connected thereto
(block 502)

Determine a resistance value that when the resistance value is connected in series between an internal load and a second bond pad, the second bond pad also being connected to the external pin, the reference buffer exhibits an improved settling response for the reference buffer output at an internal load
(block 504)

Set a variable, settable resistance sub-circuit connected in series between the internal load and the second bond pad to the resistance value, the resistance sub-circuit being configured to take on a range of resistance values
(block 506)

*Fig. 5*

REFERENCE BUFFER AMPLIFIER

BACKGROUND

Many circuit devices such as analog-to-digital converters make use of a reference signal. The reference signal maintains a constant voltage or current level with which other signals can be compared. The comparison made between these other signals and the reference signal is an integral part of the analog-to-digital conversion process. A single reference signal may be shared by multiple devices. Each of these devices or sub-circuits may have an effect on the voltage level or current level of the reference signal. Furthermore, each of these devices may have to be driven by a low impedance source. A reference buffer is thus used to prevent such effects and maintain a stable reference signal while providing a relatively low impedance output.

A reference buffer typically utilizes an amplifier circuit. The reference buffer amplifier output exhibits a response to changes in the input signal values or output load conditions. If the response of the amplifier is under damped, the amplifier output may exhibit ringing before settling to a final value in response to output load or input changes. Conversely, if the response of the amplifier is over damped, then the output of the amplifier will not respond quickly enough to changes in the amplifier input. The response of an amplifier is critically damped when the response reaches its target level in the least amount of time. By critically damping an amplifier response, ringing is reduced and the amplifier will respond to changes in a quicker manner. Although perfect critical damping is difficult as a practical matter, it is desirable to achieve an amplifier response that is as close as possible to a critically damped response. A critically damped response allows the reference buffer amplifier output to settle to a more accurate value in a smaller amount of time.

For example, an Analog-to-Digital Converter (ADC) reference signal needs to settle to a specific value in a given amount of time. The available time to settle to this specific value is proportional to the conversion rate of the ADC. This conversion rate is the number of conversions within a specified amount of time that the ADC completes. The settling accuracy is a function of the resolution of the ADC. For example the settling resolution for a pipelined ADC doubles for every bit increase in the total number of bits of that pipelined ADC.

BRIEF DESCRIPTION OF THE DRAWINGS

The accompanying drawings illustrate various examples of the principles described herein and are a part of the specification. The drawings are merely examples and do not limit the scope of the claims.

Throughout the drawings, identical reference numbers designate similar, but not necessarily identical, elements.

DETAILED DESCRIPTION

As mentioned above, a reference buffer is used to maintain a stable reference signal for use in conversion circuitry such as an ADC or a Digital-to-Analog Converter (DAC). The conversion circuitry is typically built onto an integrated circuit. The integrated circuit is sometimes referred to as a chip. In some cases, the reference buffer is an on-chip amplifier that does not utilize any external components. Such a reference buffer typically consumes larger amounts of power and is noisier than an on-chip reference buffer that utilizes larger valued off-chip capacitors. In such a reference buffer, the external capacitor stores the value of the reference signal. When a much smaller internal capacitor is connected to the external capacitor through an on-chip switch, the external capacitor typically charges the internal capacitor rapidly to essentially the same voltage that was stored across it previously. However, the reference buffer amplifier typically cannot respond this fast. Using a faster amplifier dissipates more power. By utilizing the off-chip capacitor, a faster amplifier is unnecessary and a more efficient reference buffer amplifier is realized.

The off-chip capacitor can provide for much larger values of capacitance than capacitors that can be built on the chip. An on-chip reference buffer connected to an external capacitor thus stores the reference voltage in the off-chip capacitance. When an internal circuit such as an ADC uses this reference signal, the ADC connects a load signal to the off-chip capacitor. In the case that the ADC utilizes a Multiplying Digital-to-Analog Converter (MDAC) sub-circuit, the load comprises capacitances from several capacitors used in that MDAC. Additionally, other static loads will connect to the reference voltage stored in the off-chip capacitor. The capacitors within the MDAC may be charged to various voltage levels. When these MDAC capacitors are connected to the external capacitor, the voltage level of the MDAC capacitors should reach the voltage value stored in the external capacitor as fast as possible. Because these on-chip MDAC capacitors are typically at least 10,000 times smaller than the external capacitor, the smaller capacitors are substantially forced to be charged to the voltage value stored across the external capacitor when connected in parallel to the external capacitor. However, the speed at which this occurs is dependent upon the reference buffer amplifier response. Specifically, the speed at which the smaller capacitors are charged is dependent upon the amount of ringing that occurs on the reference buffer output during the charging process.

The off-chip capacitor is typically connected to the reference buffer amplifier output terminals via a bond wire. This bond wire exhibits intrinsic inductance. Due to variations in on-chip wiring, resistance values, inductance values, transistor impedances, and capacitor values caused by variations in manufacturing, it is difficult to design a circuit with a critically damped response. Typically, the on-chip capacitance from the load circuitry and other capacitors, the inductance from the bond wires, and the inductance from other internal wiring create a resonant circuit. This resonance can be particularly problematic for applications where little time is available to wait for longer settling times. A series resistance between the bond wire to the external capacitor and the load circuitry can be used to reduce this resonance or ringing. Using a fixed on-chip resistor may somewhat reduce the ringing in the response. However, due to the above mentioned variations, it is not possible to guess a resistor value for each circuit.

In light of this and other issues, the present specification discloses a reference buffer amplifier with a resistance sub-circuit that is able to be set to a specific resistance that will cause the response of the amplifier to be faster despite manufacturing induced variation of on-chip ADC components. According to certain illustrative examples, an output terminal of a reference amplifier is connected to a first bond pad. That first bond pad is connected to an external pin via a bond wire. The external pin is used to connect to external capacitances. These external capacitances are used to maintain a stable reference signal.

The external pin is also connected to a second bond pad, also via a bond wire. The second bond pad is then connected to various loads that make use of the reference signal. These loads may include conversion circuitry such as ADCs or DACs. A resistance sub-circuit is placed in series between those loads and the second bond pad. By adjusting the equivalent resistance of this resistance sub-circuit, the response of the amplifier can be adjusted. As mentioned above, the response of the amplifier is affected by a variety of properties. The response is also affected by the resistance value of the resistance sub-circuit. Furthermore, the response is affected by the resistance and capacitance of loads associated with on-chip conversion circuitry such as MDACs in the ADC. Thus, by setting the resistance sub-circuit to the appropriate equivalent resistance, the reference buffer amplifier response can be improved to allow for a faster setting time. This is done by making adjustments to the RLC (Resistance, Inductance, Capacitance) network so that the reference buffer approaches a critically damped response The resistance sub-circuit can be designed into the on-chip reference buffer amplifier. The resistance sub-circuit may include several resistors in parallel or series. The resistors may also be made of different materials. The resistors can be selectively switched to contribute to the equivalent resistance of the entire sub-circuit.

As the resistance sub-circuit is able to take on varying resistance values, each chip that has this resistance sub-circuit can be set according to the characteristics of the chip in which it is placed. For example, after the reference buffer has been manufactured, the characteristics of the RLC network can be determined. Due to manufacturing variations, each chip can be different. The appropriate resistance that causes the amplifier to approach a critically damped response can be determined by test procedures which may be performed at the manufacturing factory. The resistance sub-circuit can then be set to that resistance.

Through use of methods and systems described herein, conversion circuitry can make use of a reference signal with a fast settling response that allows for a high speed, high resolution low power analog to digital conversion. Particularly, by using a resistance sub-circuit, an equivalent resistance can be trimmed in response to a test performed after manufacture to create high speed, high resolution ADCs. This is because the resistance sub-circuit is set to the appropriate resistance level that will cause the associated amplifier to approach a critically damped response.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Figure 1:
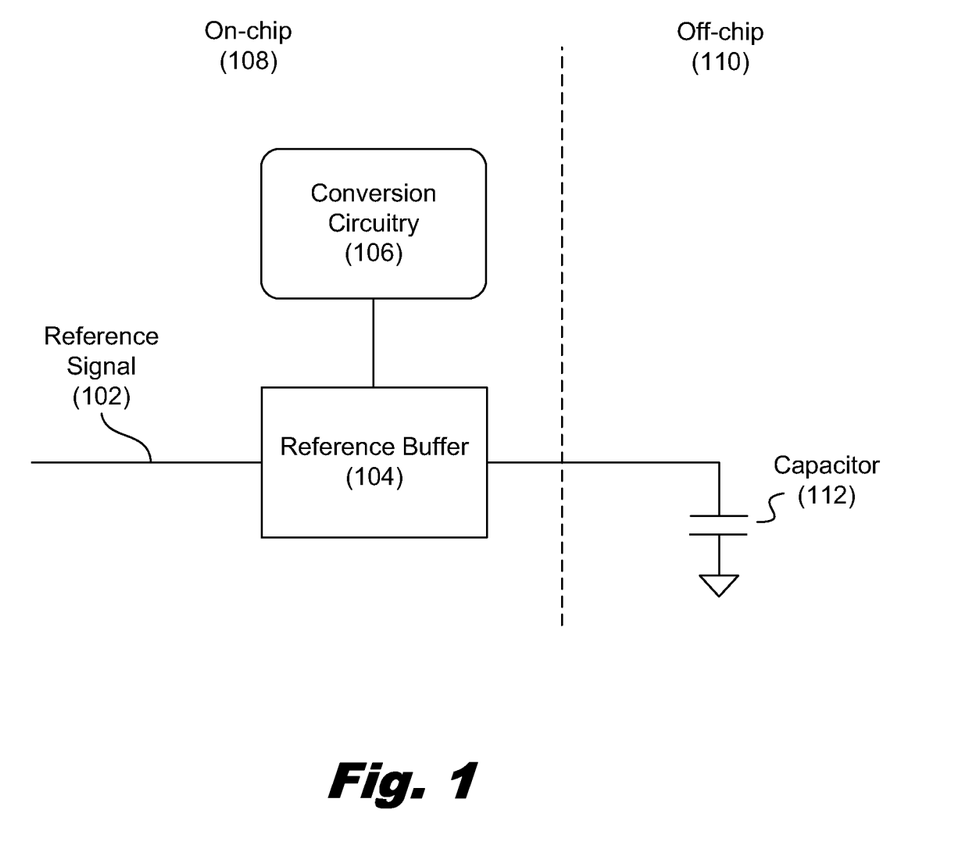
FIG. 1 is a diagram showing an illustrative circuit system utilizing a reference buffer, according to one example of principles described herein.

Referring now to the figures, FIG. 1 is a diagram showing an illustrative circuit system utilizing a reference buffer. The components to the left of the dotted line illustrate on-chip (108) components and the components on the right side of the dotted line represent off-chip (110) components. According to certain illustrative examples, conversion circuitry (106) such as an ADC or DAC will often make use of a reference signal (102). The reference signal (102) serves as a stable signal level with which other signals may be compared.

Typically, the reference buffer (104) and conversion circuitry (106) are manufactured within an integrated circuit chip. While it is possible that the capacitances used to maintain a stable voltage level may also be manufactured within the chip, doing so generally results in a capacitance that is materially smaller than external capacitors. These smaller values make this architecture alternative impractical because these smaller capacitors cannot charge the capacitive loads without creating large errors. Alternative high speed reference buffers can also be built on chip. However, such reference buffers consume larger amounts of power. To compensate for this, the on-chip devices may be manufactured so that they are able to connect to an off-chip capacitor (112). This is done by connecting the reference buffer amplifier to a bond pad. The bond pad is then connected to an external pin via a bond wire. The external pin is where the off-chip capacitor (112) is connected to the integrated circuit chip.

Figure 2:
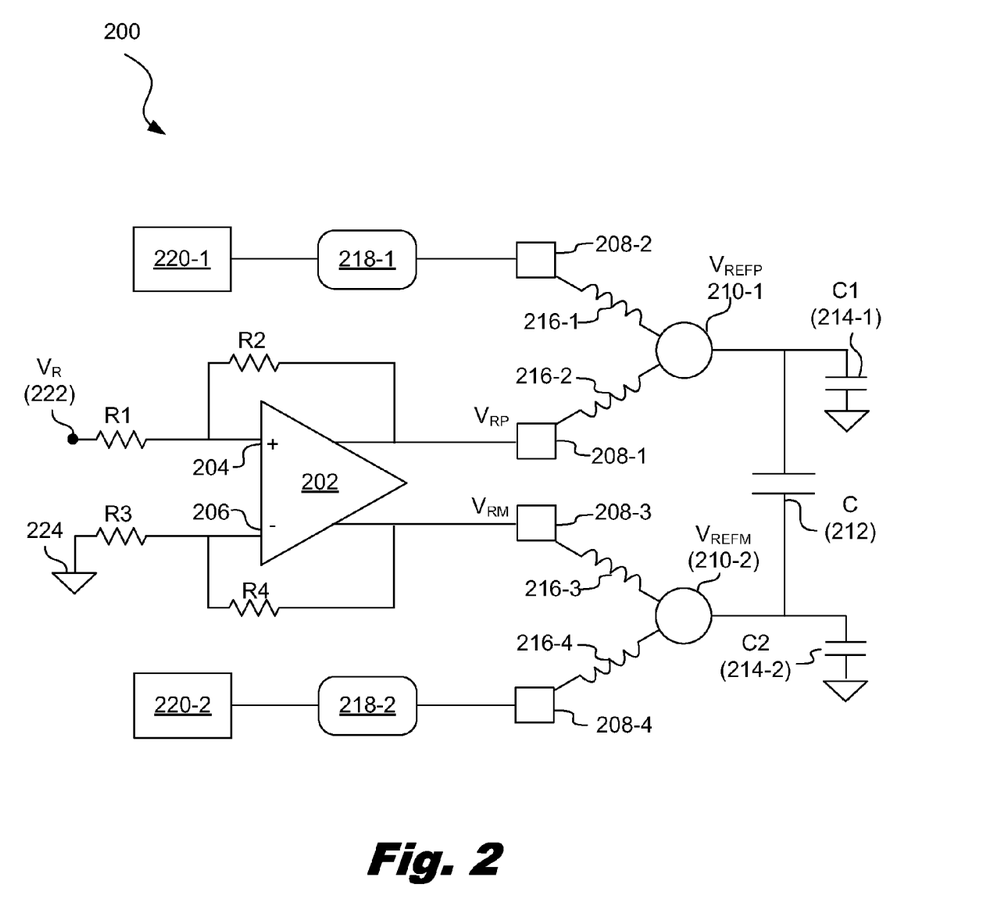
FIG. 2 is a diagram showing an illustrative reference buffer amplifier, according to one example of principles described herein.

FIG. 2 is a diagram showing an illustrative reference buffer amplifier (200). According to certain illustrative examples, the reference buffer amplifier may be a differential amplifier (202). A differential amplifier is set to maintain a constant voltage different between two output terminals. Thus, there are two reference signals. $V_{REFP}$ is the reference signal that is fed back into the positive input terminal of the amplifier (202) and $V_{REFM}$ is the reference signal that is fed back into the negative input terminal (206) of the differential amplifier (202). In this case, a voltage divider is used to feed back only a portion of the output signal into the input terminals The positive terminal (204) is connected to a $V_R$ input signal (222) through resistor R1. The $V_R$ input signal (222) is a static Direct Current (DC) reference voltage. The input terminal (204) also receives a voltage divided feedback signal from the amplifier (202) output. Specifically, R1 and R2 form a voltage divider to feed back a portion of the amplifier (202) output. The negative terminal (206) is connected to ground (224) through resistor R3. The negative input terminal (206) also receives a voltage divided feedback signal from the amplifier (202) output. Specifically, R3 and R4 form a voltage divider to feed back a portion of the amplifier (202) output. R1, R2, R3, and R4 may vary in order to adjust the amplitude of the amplifier output signal.

$V_{RP}$ is associated with a first bond pad (208-1). This bond pad (208-1) is connected to a first external pin (210-1) via a bond wire (216-2). The first external pin (210-1) is also connected to a second bond pad (208-2) via a bond wire (216-1). The second bond pad is connected to various loads (220-1) through a first resistance sub-circuit (218-1). Both the first bond pad (208-1) and the second bond pad (208-2) are connected to the first external pin (210-1) via bond wires. The signal at the first external pin (210-1) is referred to as $V_{REFP}$.

$V_{RM}$ is associated with a third bond pad (208-3). This bond pad (208-3) is connected to a second external pin (210-2) via a bond wire. The second external pin (210-2) is also connected to a fourth bond pad (208-4) via a bond wire. The fourth bond pad is connected to various loads (220-2) through a second resistance sub-circuit (218-2). Both the third bond pad (208-3) and the fourth bond pad (208-4) are connected to the second external pin (210-2) via bond wires. The signal at the second external pin (210-2) is referred to as $V_{REFM}$.

An external capacitance C (212) is connected between the two external pins (210). As mentioned above, use of an external capacitor can reduce power and provide better bandwidth. In addition to a capacitor placed between the two external pins, capacitors C1 (214-1) and C2 (214-2) can also be used as well. These capacitors (214-1, 214-2) are placed between the external pins and ground. These capacitors (214-1, 214-2) can help make the reference buffer more stable and improve the phase margin of the amplifier. The capacitors can also store charge externally that can be transferred to the internal load and can further improve settling time.

The inductances in the bond wires (216) and internal wiring inductance and capacitances will be referred to as the LC (Inductance Capacitance) network. The reference buffer amplifier typically makes use of a capacitor for compensation purposes to keep the amplifier output stable. While an on-chip capacitor may be used to compensate the reference buffer amplifier, the external capacitor may also be used to do the compensation. Thus, an additional internal capacitor does not have to be used.

The voltage signal at the second bond pad (208-2) will follow the same the voltage signal at the first pin (210-1) where $V_{REFP}$ is. Thus, the conversion circuitry is provided with a stable reference voltage signal that is dependent on the settling of the ringing from LC networks and does not involve the amplifier directly. Any charge required by the load (220-1) comes directly from the external pin (210-1) and does not to the first order use any charge from $V_{RP}$ instantaneously. Thus the main amplifier (202) is not disturbed or required to respond quickly. This separation from the amplifier (202) path by using bond wires where there is no direct connection between the first and second bond pads (208-1, 208-2) causes the settling time of the conversion circuitry to be faster. Settling time refers to the amount of time it takes for the circuitry signal level to settle to a new level within predefined parameters.

As is illustrated in FIG. 2, by using separate bond pads and not allowing a shorted connection between the first bond pad (208-1) and the second bond pad (208-2), any load transients caused by changes in the load (220-1) are handled by charge flowing from the external capacitor (212) through the inductor (216-1). The inductor (216-2) connecting the external capacitor (212) to the reference buffer remains relatively undisturbed. Likewise, any load transients caused by changes in the load (220-2) are handled by charge flowing from the external capacitor (212) through the inductor (216-4). The inductor (216-3) connecting the external capacitor (212) to the reference buffer amplifier (202) remains relatively undisturbed. Thus, the amplifier (202) is not too affected by these changes in the loads. Because the amplifier (202) is less affected, a faster settling time can be achieved.

Furthermore, by using separate bond pads, a low pass filter is formed by the inductors (216-2, 216-3) connected to the bond pads (208-1, 208-3) and the external capacitor (212). This low pass filter reduces noise on the output signal of the amplifier. This noise filtered signal is then fed through the inductors (216-1, 216-4) to the on-chip loads (220-1, 220-2). Because the loads are provided with a cleaner signal, the overall noise level of the ADC circuitry comprising the loads (220) is reduced.

The circuit illustrated in FIG. 2 is a differential reference buffer amplifier designed to drive a differential load using a differential reference signal. A differential reference signal is one in which two signals may vary in time. However, the difference between those signals remains constant. Although a differential reference buffer amplifier is illustrated, the principles described herein may be applied to a single ended reference buffer as well.

Figure 3:
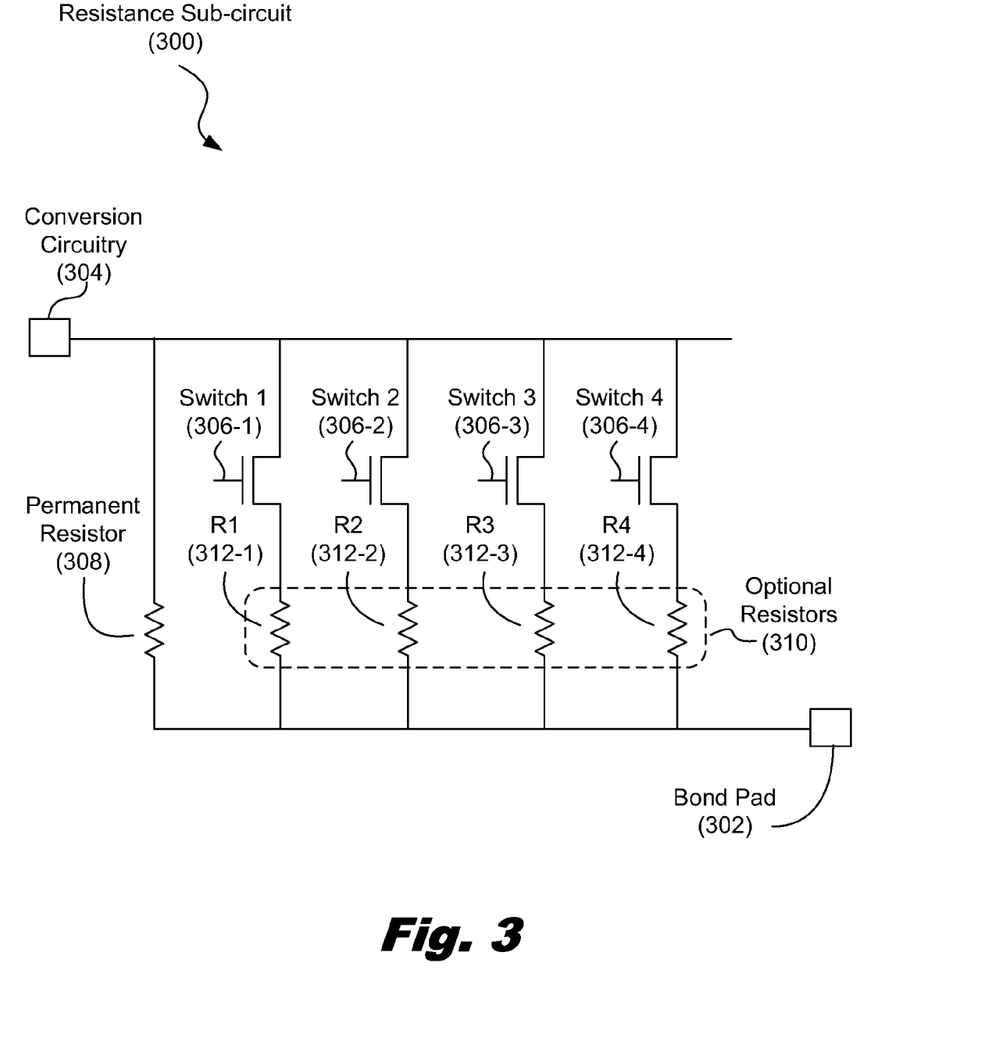
FIG. 3 is a diagram showing an illustrative variable resistance sub-circuit, according to one example of principles described herein.

FIG. 3 is a diagram showing an illustrative variable resistance sub-circuit. As mentioned above, the resistance sub-circuit (300) is placed between the bond pad (302) and the conversion circuitry (304). The resistance sub-circuit (300) includes a set of resistors (308, 310). Some of the resistors may be optional resistors (310). The optional resistors (310) are those which may be selectively switched to contribute to the total equivalent resistance of the resistance sub-circuit (300). The permanent resistors (308) are those which will always contribute to the total equivalent resistance of the resistance sub-circuit (300).

The optional resistors (310) may be selectively allowed to contribute to the total equivalent resistance through use of a number of switches. In the example illustrated in FIG. 3, Switch 1 (306-1) controls R1 (312-1), Switch 2 (306-2) controls R2 (312-2), Switch 3 (306-3) controls R3 (312-3), and Switch 4 (306-4) controls R4 (312-4). When a switch is on, the resistor associated with that switch is placed in parallel with permanent resistors (308) and thus affects the equivalent resistance. Conversely, when a switch is off, the resistor associated with that switch will not contribute to the total equivalent resistance of the resistance sub-circuit. Various combinations of resistors will thus provide varying levels of total equivalent resistance.

In one example, the switches may be either N-type Metal Oxide Semiconductor (NMOS) devices or P-type Metal Oxide Semiconductor (PMOS) devices. For example, in the amplifier illustrated in FIG. 2, PMOS devices may be used in the resistance sub-circuit (e.g. 218-1, FIG. 2) connected with $V_{REFP}$. Additionally, NMOS devices may be used in the resistance sub-circuit (e.g. 218-2, FIG. 2) connected to $V_{REFM}$. In some cases, other types of transistors may be used, including Complementary Metal Oxide Semiconductor (CMOS) switches.

For example, to cause the resistance sub-circuit to exhibit a desired resistance level, a specific combination of switches set to the on position will provide an equivalent resistance near the desired resistance level. Although the illustration in FIG. 3 shows only four switches, a much larger number of switches may be used in a practical implementation of principles described herein.

In some cases, switches will also exhibit an intrinsic resistance even when in an on state. For example, the intrinsic resistance of a transistor that is in the on state will affect the total equivalent resistance. Additionally, the intrinsic resistance of many transistors exhibits a high temperature coefficient. This means that the intrinsic resistance will change more in response to changes in temperature. This can be problematic for keeping the total equivalent resistance at the appropriate level that will critically dampen the amplifier response.

To compensate for this, the material used to form the resistors may be one with a negative temperature coefficient. Thus, the resistance will decrease in response to a rise in temperature. If the intrinsic resistance of the switches increases with an increase in temperature, the resistance of the associated resistors will decrease with that rise in temperature and thus compensate for the effects of temperature. In some cases, the resistance value of the resistors (312) may be much higher than the intrinsic resistance of the switches. Thus, changes in the intrinsic resistance of the switches resulting from changes in temperature will have a smaller effect on the total equivalent resistance.

Use of such a variable resistance sub-circuit allows for an efficient method of achieving better settling times by producing an amplifier response that closer approaches the critically damped point. Furthermore, this faster settling time is achieved without the use of space consuming on-chip capacitances and on-chip damping networks.

Figure 4:
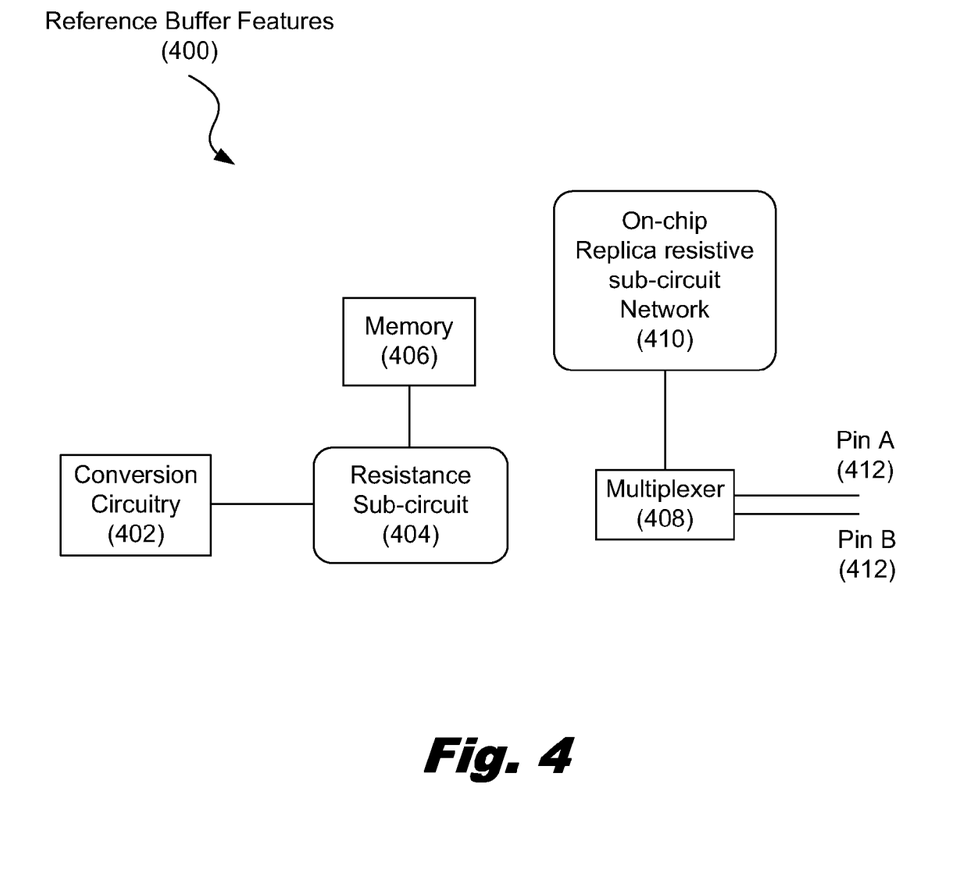
FIG. 4 is a diagram showing illustrative reference buffer amplifier features, according to one example of principles described herein.

FIG. 4 is a diagram showing illustrative reference buffer amplifier features (400). According to certain illustrative examples, the resistance sub-circuit may be associated with a memory (406). This memory may be used to store the configuration of the resistance sub-circuit (404) that results in the desired equivalent resistance. The memory (406) may be a One-Time Programmable (OTP) memory. With such a memory, the configuration of the resistance sub-circuit is programmed into the OTP memory during or after a test performed at manufacture. From this point on, the resistance sub-circuit (404) does not need to be reset. The resistance sub-circuit (404) will thus maintain the appropriate resistance that will approach a critically damped amplifier response and thus allow the reference buffer to achieve a faster settling time.

According to certain illustrative examples, an on-chip replica resistive sub-circuit network (410) may be formed into the chip. The replica network (410) is designed to exhibit the same impedance characteristics as the resistance sub-circuit (404). As mentioned above, there are typically variations that occur as a result of the manufacturing process. For example, resistance values of particular components may vary 15-30 percent among different chips. However, the variation between similar components within the same chip is typically 0.1 percent.

After it has been determined the resistance value to which the resistance sub-circuit (404) should be set, the sub-circuit is then set to that value. However, it is difficult to determine which setting will produce the desired equivalent resistance for the resistance sub-circuit. This is due to the above mentioned manufacturing variations. Furthermore, it is difficult to isolate the resistance sub-circuit to test the resistance values at different settings due to the way it is formed within this chip. In light of this issue, the replica network (410) is designed to mimic the impedance characteristics of the resistance sub-circuit. However, the replica network (410) is formed in a manner so as to allow easy testing. The replica network (410) can be set to connect to external pins that allow for testing. In the case that the chip has a limited number of pins, a multiplexer (408) may be used to connect the replica network (410) to those external pins (412).

For example, it may be determined that in order to provide an amplifier response that is the closest to the critically damped response, an equivalent resistance of 10 ohms should be used. It may be the case that the resistance sub-circuit can take on a range of 16 discrete values. However, due to the manufacturing variations, it cannot be know what setting will produce a resistance closest to 10 ohms. Because the replica network (410) presumably manifests the same manufacturing variations as the real resistor sub-circuit (404), the equivalent resistance of the replica network can be tested at each discrete setting. From these tests, it can be determined which setting will produce the equivalent resistance closest to the desired value that will produce the best amplifier response.

Figure 5:
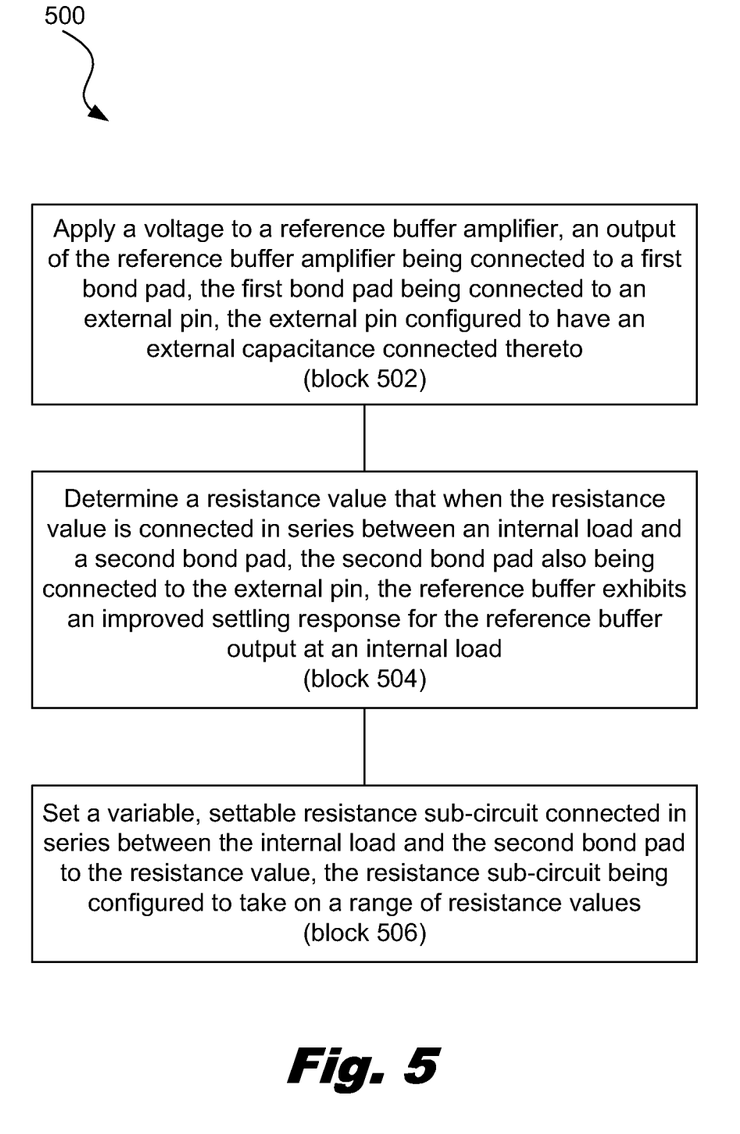
FIG. 5 is a flowchart showing an illustrative method for operating a reference buffer amplifier with a variable resistance sub-circuit, according to one example of principles described herein.

FIG. 5 is a flowchart showing an illustrative method (500) for operating a reference buffer amplifier with a variable resistance sub-circuit. According to certain illustrative examples, the method includes applying (block 502) a voltage to a reference buffer amplifier, an output of said reference buffer amplifier being connected to a first bond pad, said first bond pad being connected to an external pin, said external pin configured to have an external capacitance connected thereto. The method further includes determining (block 504) a resistance value that when the resistance value is connected in series between an internal load and to a second bond pad, the second bond pad also being connected to the external pin, the reference buffer exhibits an improved settling response for the reference buffer output at an internal load, and setting (block 506) a variable, settable resistance sub-circuit connected in series between the internal load and the second bond pad to the resistance value, the resistance sub-circuit being configured to take on a range of resistance values.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A reference buffer within an integrated circuit comprising:
    a first output terminal of an amplifier connected to a first bond pad, said first bond pad being connected to a first external pin of said integrated circuit chip, said first external pin to allow an external capacitance to be connected to said output terminal; and
    a variable, settable resistance sub-circuit connected in series between an internal load and a second bond pad, said second bond pad also being connected to said first external pin;
    wherein, said resistance sub-circuit is configured to be set to exhibit a resistance value that will cause said amplifier to more closely approach a critically damped response.

2. The reference buffer of claim 1, further comprising:
    a second output terminal of said amplifier connected to a third bond pad, said third bond pad connected to a second external pin, said second external pin to allow said external capacitance to exist between said first external pin and said second external pin; and
    a second variable settable resistance sub-circuit connected in series between a second internal load and a fourth bond pad, said fourth bond pad also being connected to said second external pin;
    wherein said second resistance sub-circuit is configured to be set to exhibit a resistance value to improve a settling response of said reference buffer output at said second load.

3. The reference buffer of claim 2, wherein a differential output between said first external pin and said second external pin comprises a differential reference buffer output used to differentially drive said internal load.

4. The reference buffer of claim 2, further comprising capacitors connected between said external pins and ground.

5. The reference buffer of claim 1, wherein said first bond pad and said second bond pad are connected to said first external pin via a bond wire without a shorted connection between said first bond pad and said second bond pad.

6. The reference buffer of claim 1, wherein said resistance sub-circuit comprises a set of resistors in at least one of: parallel and serial, each of said resistors being selectively settable to contribute to said resistance value through use of a set of transistors.

7. The reference buffer of claim 6, wherein said transistors have a lower resistance value than said resistors such that changes in external conditions will have a smaller effect on said resistance value.

8. The reference buffer of claim 6, wherein a temperature coefficient of said resistors is such that it compensates for a temperature coefficient of intrinsic resistance within said transistors.

9. The reference buffer of claim 6, wherein said resistors vary in material.

10. The reference buffer of claim 1, further comprising, a replica network designed to mimic the characteristics of said resistance sub-circuit, said replica network connected to external pins.

11. The reference buffer of claim 1, further comprising a memory to store a setting of said resistance sub-circuit.

12. The reference buffer of claim 1, further comprising:
a first bond wire connecting the first bond pad to the first external pin; and
a second bond wire connecting the second bond pad to the first external pin,
in which the first and second bond wires are the only bond wires connected to the first output terminal of the amplifier.

13. A method for operating a reference buffer amplifier, the method comprising:
applying a voltage to a reference buffer amplifier, an output of said reference buffer amplifier being connected to a first bond pad, said first bond pad being connected to an external pin, said external pin configured to have an external capacitance connected thereto;
determining a resistance value that when said resistance value is connected to a second bond pad, said second bond pad also being connected to said external pin, said reference buffer exhibits an improved settling response for said reference buffer output at an internal load; and
setting a variable, settable resistance sub-circuit connected in series between said internal load and said second bond pad to said resistance value,
said resistance sub-circuit being configured to take on a discrete range of resistance values.

14. The method of claim 13, wherein said first bond pad and said second bond pad are connected to said first external pin via a bond wire without any a shorted connection between said first bond pad and said second pad.

15. The method of claim 13, wherein said resistance sub-circuit comprises a set of resistors in at least one of: a parallel and a serial configuration, each of said resistors being selectively allowed to contribute to said resistance value through use of a set of transistors.

16. The method of claim 15, wherein said transistors have a lower resistance value than said resistors such that changes in external conditions will have a negligible effect on said resistance value.

17. The method of claim 15, wherein a temperature coefficient of said resistors is such that it compensates for a temperature coefficient of intrinsic resistance within said transistors.

18. The method of claim 13, further comprising
determining resistance values of a replica network at different settings,
said replica network designed to mimic said resistance sub-circuit and be directly connected to external pins;
wherein setting said resistance sub-circuit to said resistance value comprises setting said resistance sub-circuit to a same setting as that which caused said replica network to exhibit a value closest to said resistance value.

19. The method of claim 18, further comprising, setting said resistance sub-circuit to a resistance value that critically damps said reference buffer amplifier when said resistance sub-circuit is connected to said replica network.

20. The method of claim 13, further comprising, storing a setting of said resistance sub-circuit within a memory associated with said resistance sub-circuit.

21. A differential reference buffer amplifier comprising:
a first output terminal connected to a first bond pad, said first bond pad being connected to a first external pin of said integrated circuit chip, said first external pin to allow an external capacitance to be connected to said output terminal; and
a first variable, settable resistance sub-circuit connected in series between an internal load and a second bond pad, said second bond pad also being connected to said first external pin;
a second output terminal connected to a third bond pad, said third bond pad connected to a second external pin, said second external pin to allow said external capacitance to exist between said first external pin and said second external pin; and
a second variable settable resistance sub-circuit connected in series between an internal load and a fourth bond pad, said fourth bond pad also being connected to said second external pin;
wherein, said resistance sub-circuits are configured to be set to exhibit a resistance value that will improve a settling response of said reference buffer output at said internal load.

* * * * *